United States Patent [19]

Hoyt

[11] Patent Number: 5,075,621
[45] Date of Patent: Dec. 24, 1991

[54] CAPACITOR POWER PROBE

[75] Inventor: Edward S. Hoyt, Williston, Vt.

[73] Assignee: International Business Machines Corporation, Armonk, N.Y.

[21] Appl. No.: 285,974

[22] Filed: Dec. 19, 1988

[51] Int. Cl.⁵ .............................................. G01R 31/02
[52] U.S. Cl. ................................. 324/158 P; 324/72.5
[58] Field of Search ............... 324/158 P, 158 F, 72.5; 333/204, 238, 246

[56] References Cited

U.S. PATENT DOCUMENTS

| | | | |
|---|---|---|---|
| 3,702,439 | 11/1972 | McGahey et al. | 324/158 P |
| 3,849,728 | 11/1974 | Evans | 324/158 F |
| 4,161,692 | 7/1979 | Tarzwell | 324/158 P |
| 4,199,737 | 4/1980 | Patterson et al. | 333/246 |
| 4,617,609 | 10/1986 | Utner et al. | 361/321 C |
| 4,623,839 | 11/1986 | Garretson et al. | 324/158 P |
| 4,638,402 | 1/1987 | Lim et al. | 361/328 |
| 4,791,363 | 12/1988 | Logan | 324/158 F |

OTHER PUBLICATIONS

IBM TDB, vol. 18, No. 11, Apr. 1976, pp. 3629-3630, "Bypass Capacitor for Chip Probe", A. Bry et al.
IBM TDB, vol. 18, No. 3, Aug. 1975, pp. 749-750, "High-Performance AC Chip Contactor", R. M. Morton et al.

Primary Examiner—Reinhard J. Eisenzopf
Assistant Examiner—Edward Urban
Attorney, Agent, or Firm—Francis J. Thornton

[57] ABSTRACT

A probe for testing integrated circuit wafers is disclosed herein. The probe comprises a ceramic body having an extended voltage contact on the upper most surface, an extended ground contact on the lower most surface, sets of interdigitated internal metallic plates, one set of plates beginning at the voltage contact and extending part way into the body and the other set of plates beginning at the ground contact and extending interdigitally into the body between the other set of plates, but separated therefrom by the material of the body and a needle-like member contacts which connected to one of the needle-like members has a cantilevered tip adapted to contact a semiconductor circuit interconnection pad.

9 Claims, 3 Drawing Sheets

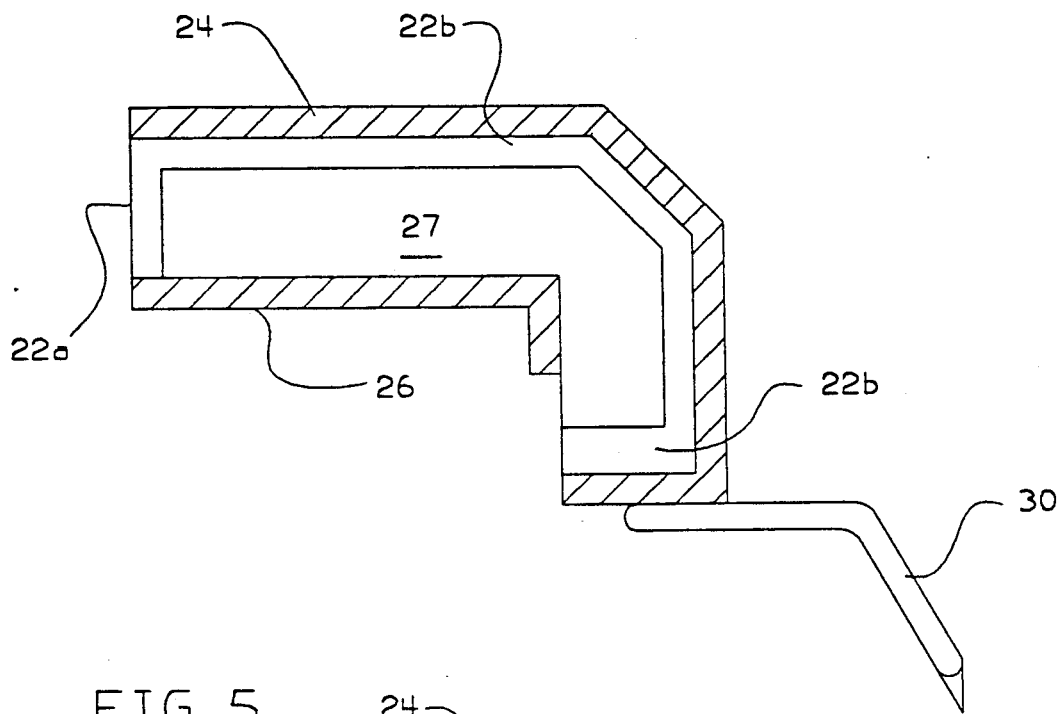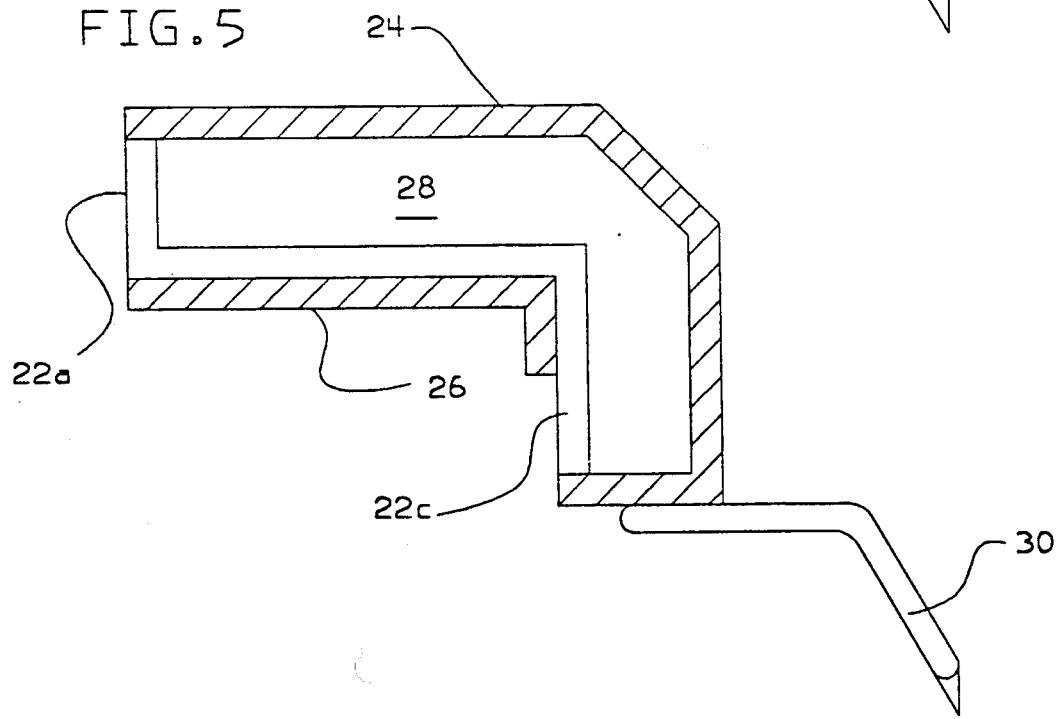

CAPACITOR POWER PROBE

BACKGROUND OF THE INVENTION

1. Field Of The Invention

The present invention relates to the field of integrated circuit testing devices and more specifically to a probe card and a probe device for testing integrated circuit wafers.

2. Prior Art

Several hundred distinct semiconductor integrated circuits are manufactured in a single wafer of semiconductor material and are later cut out of the wafer in the form of semiconductor chips. Each of the integrated circuits while in wafer form or in chip form must be tested. U.S. Pat. No. 4,623,839; U.S. Pat. No. 3,702,439; and U.S. Pat. No. 3,849,728 all disclose probe cards for testing integrated circuits in either chip or wafer form. Such cards generally consist of a printed circuit board having a central opening providing access to the chip to be tested together with a series of spaced conductive individual probe assemblies arranged in a ring around the opening. Each probe assembly consists of a probe body connected to a respective conductive line on the board and a flexible metallic needle or blade extending towards the center of the opening. The blade is adapted to contact selected parts on the chip being tested so that electrical signals may be transmitted to the chip under test.

U.S. Pat. No. 4,161,692, teaches a ceramic probe support provided with a compensating circuit thereon which compensates or offsets undesirable impedance characteristics associated with long circuit paths between the probe member and the test equipment. This patent indicates that the construction of the support is such as to enhance the local capacitance characteristic to provide greater circuit isolation due to high surface resistivity, and to minimize the capacitive effect with the probe members, thus allowing both high frequency input signals to be used and the monitoring of high frequency output signals. However, as the frequency characteristics of the applied signals continues to increase, i.e. over 100 MHz, and as greater numbers of circuits switch simultaneously, the type of devices shown in U.S. Pat. No. 4,161,692 begin to fail and cannot carry such high frequency signals without degradation.

It therefore became necessary to create a new probe assembly which would provide power decoupling when the frequencies are greater than 100 MHz.

SUMMARY OF THE INVENTION

The present invention is a unique power probe assembly for testing integrated circuit wafers and providing improved efficiency, function speed and power decoupling when the applied signals are at a frequency of 100 MHz or above.

The probe assembly of the present invention basically comprises a ceramic body having upper and lower opposed faces, one of which carries an extended voltage contact while the other carries an extended ground contact, and two sets of interdigitated internal metallic plates. One set of the internal plates, i.e. the voltage plates, begin at the voltage contact and extend more than halfway, but not fully, through the body while the other set of internal plates, i.e. the ground plates, begin at the ground contact and also extend more than halfway but not fully through the body. These voltage plates and ground plates are separated one from the other by the ceramic material of the body.

The invention thus provides an improved probe assembly that will permit 100 MHz signals to be transmitted from a signal line to the chip under test without signal degradation found with the prior art assemblies.

This and other features of the invention are best understood from the following detailed description made in conjunction with the accompanying drawings wherein:

FIG. 4 is a sectional view of FIG. 2 taken along the lines 4—4.

FIG. 5 is a sectional view of FIG. 2 taken along the lines 5—5.

DESCRIPTION OF THE INVENTION

Figure 1:
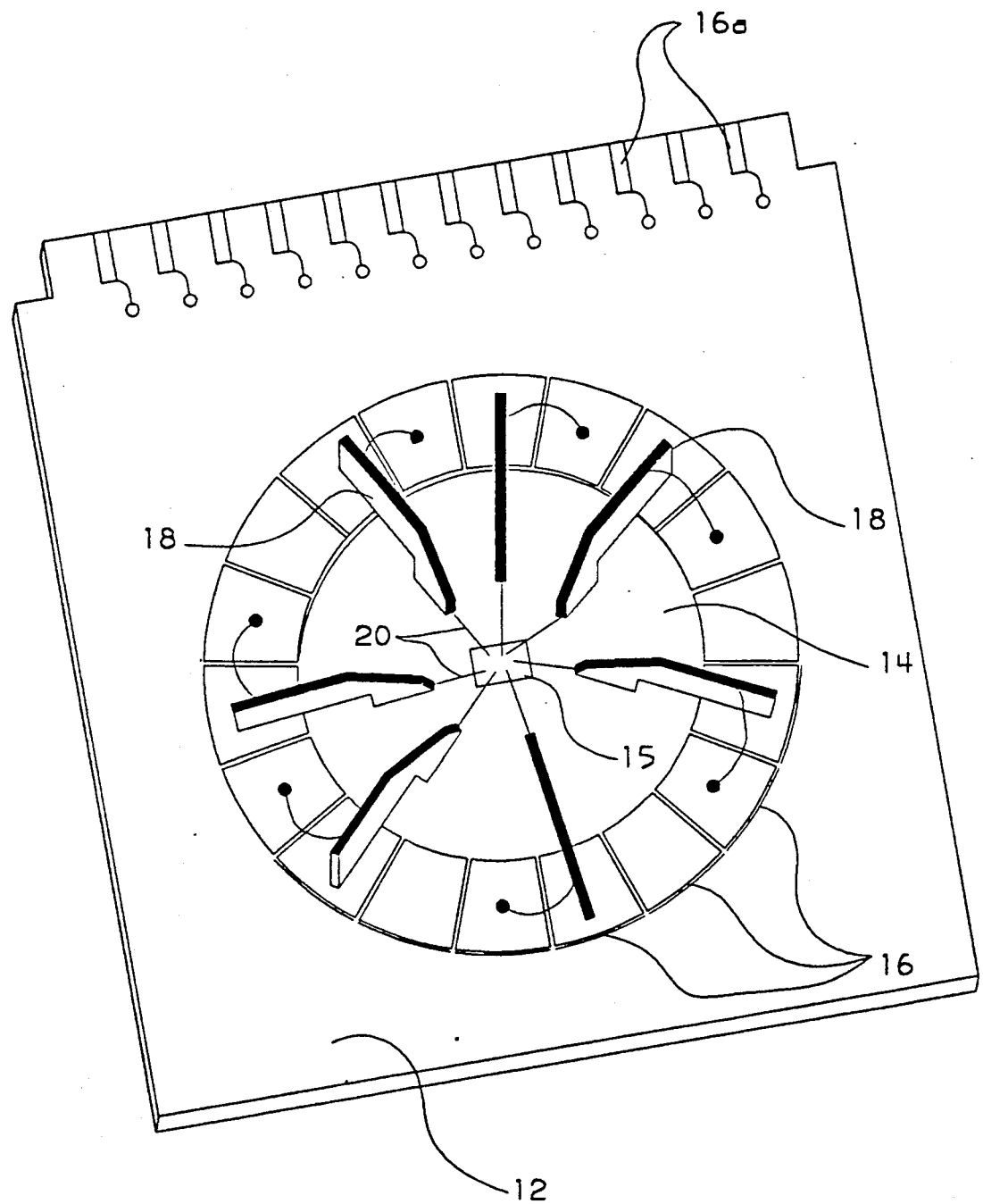
FIG. 1 is a perspective view of a probe card, using a probe assembly built in accordance with the present invention for testing integrated circuits and thin film patterns.
Figure 2:
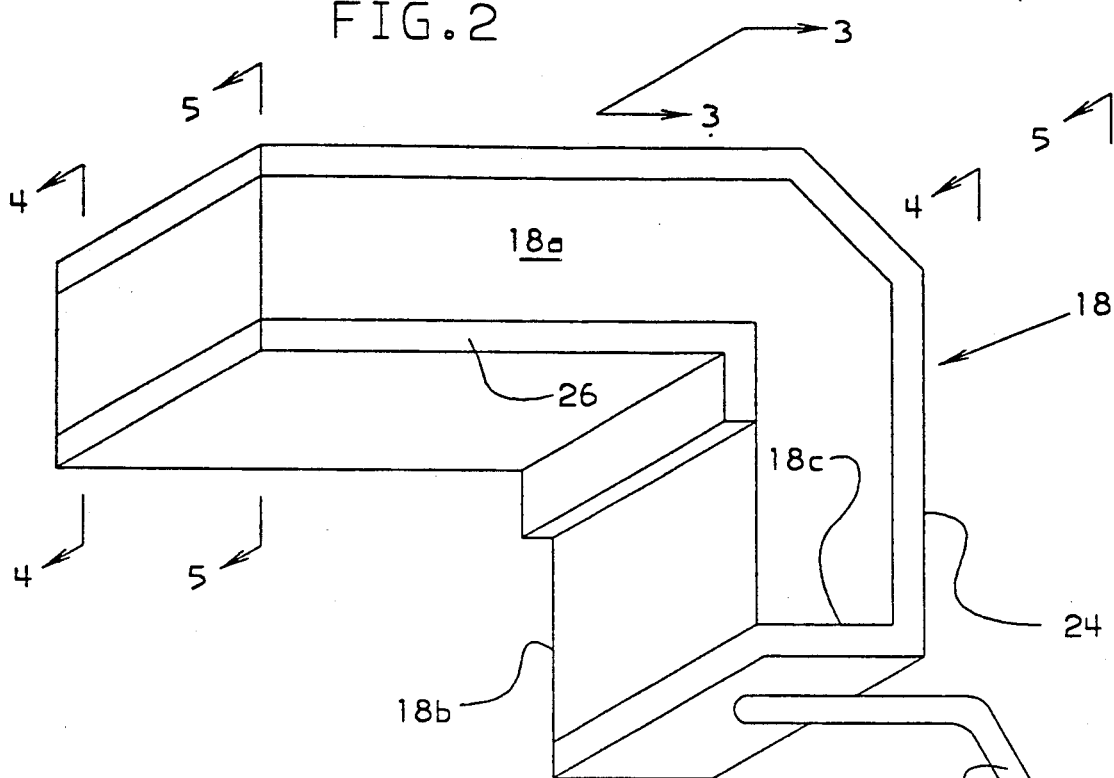
FIG. 2 is a perspective view of one of the probe assemblies of the present invention as used on the probe card of FIG. 1.
Figure 3:
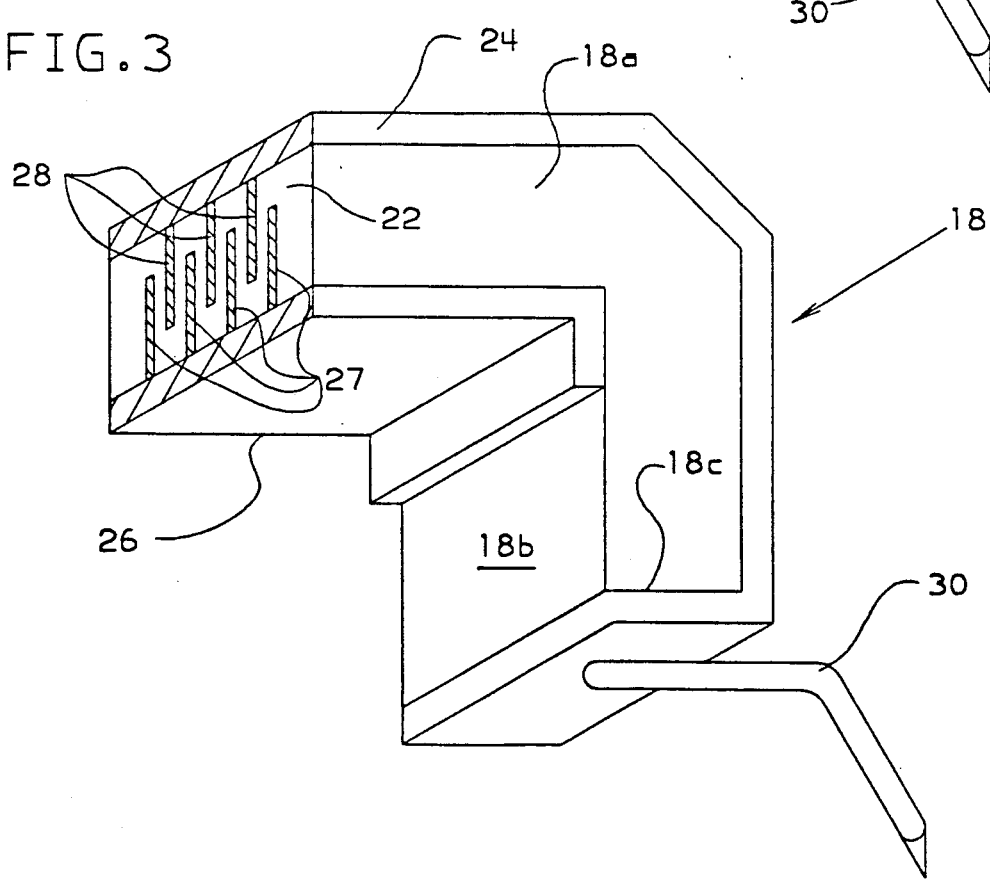
FIG. 3 is a sectional view of FIG. 2 taken along the lines 3—3.

Referring now to FIG. 1 there is shown a probe card 12 having a central opening 14 providing access to an integrated circuit 15 to be tested. The opening 14 is surrounded by a ring of spaced conductive areas 16 to selected ones of which probe assemblies 18 are bonded and cantilevered. The areas 16 are connected via appropriate printed circuit board circuitry (not shown) to external circuit board connections 16a and thence to suitable power and signal sources (not shown) in accordance with techniques well known to the industry. The probe assemblies 18 overlie the opening 14 and are so positioned that their wire tips 20 register with the pad or contact pattern of the integrated circuit 15 to be tested.

The number of probe assemblies to a card and their respective positioning are of course determined by the placement of the contacts on the integrated circuit pattern being tested.

As shown in FIGS. 2, 3, 4, and 5 each probe assembly 18 consists of a ceramic body 22, carrying a lower ground plane or electrode 26 and an upper voltage or signal plane or electrode 24, to which a flexible needle 30 is affixed for contacting input or output (I/O) pads on a semiconductor chip.

The probe assembly 18, of the present invention, further has a plurality of interdigitated plates 27 and 28 immeshed in the ceramic material 22 so as to lie between and generally perpendicular to the signal plane 24 and the ground plane 26. Plates 28 are electrically connected to the upper voltage signal plane 24 and the plates 27 are electrically connected to the lower ground plane 27.

The process for forming the unique probe of the present invention begins with selecting a plurality of unfired L-shaped sheets, i.e. so-called green sheets of ceramic material 22a. These sheets of ceramic material 22a are preferably formed of Barium Titanate ($BaTiO_3$) and are selected to have a dielectric constant of 2000 when the sheets are 0.0015 inches in thickness. These green sheets are coated on one side with a conductive base material such as metallic nickel, approximately 0.005 inches in thickness deposited thereon by any convenient method such as the so-called silk screen process well known in the art or by sputtering or evaporation of the like. These deposits of the conductive base material may then be coated with gold by any convenient method, such as plating, both electrode and electroless, sputtering, evaporation, or the like. These deposits of nickel and gold form the plates 27 and 28.

It should be noted as shown in FIG. 4 that these deposits of metal on plate 27 is such that an upper perimeter of 22b of the underlying sheet 22a of ceramic is left unmetallized to prevent electrical contact between plate 27 and plane 24. However, plate 27 extends to the lower edge of the sheet 22a so that it can make an intimate electrical contact with the underlying ground plane 26 when ground plane 26 is subsequently formed. Similarly, a perimeter 22c lies beneath plate 28 so that plate 28 begins slightly above the inner lower edge of the green sheet 22a so as to avoid contact with plane 26, and extends up to the upper edge of the green sheet 22a so that it can make an intimate electrical contact with the voltage electrode 24 when electrode 24 is placed on the finished probe.

Once the ceramic green sheets 22a have been metallized as discussed above they are placed in a suitable press under a pressure of approximately 1500 pounds per square inch and fired at approximately 1090° C. to fuse the coated plates and the green sheets 22a into a single solid ceramic mass 22 with the plates 27 and 28 secured within the mass. Then using suitable deposition methods, such as described above, the upper plate 24 and the lower plate 26 are formed on the ceramic body. The upper electrode 24 forms an electrical contact with the upper edges of the internal plates 28 at the upper surface of the ceramic body 22, and the lower or ground electrode 26 contacts the lower edges of the internal plates 27 at the lower surface of the ceramic body 22.

The lower or ground plane 26 is generally L-shaped and extends down and across the entire inner surface of the layer arm 18a of the probe and also extends down and across a portion of the short arm 18b of the probe. This permits the probe to be firmly bonded by soldering or the like on one of the conductive areas 16 as shown in FIG. 1.

The upper or signal plane 24 extends across and down the entire outer surface of both the long and the short arms 18a and 18b of the probe 18 and also is formed to wrap around the tip or end 18c of the short arm 18b of the probe 18.

Mounted to this portion of the signal plane 24 that wraps around the end 18c of the short arm 18b is a flexible needle 30, formed of tungsten or the like, which is positioned and shaped to intimately contact electrically an I/O (input/output) pad on the surface of the chip 15 as shown in FIG. 1.

By varying the distance between the various plates 27 and 28, the amount of their overlap as well as selecting different materials with different dielectric constants the capacitance of the probe 18 can be tailored to any specific capacitance within a broad range by one skilled in the art.

Thus, there has been described a unique, improved probe useful for testing of semiconductor devices especially when signals of 100 MHz or higher need to be transmitted to the semiconductor device under test without degradation.

The power probe of the present invention as described above has a low inductance and provide power decoupling especially at frequencies higher than 100 MHz and especially during simultaneous switching of the circuits on the chip. The probe of the present invention further has a reduced impedance.

While the invention has been particularly shown and described with reference to a preferred embodiment thereof it would be understood by those skilled in the art that various changes in form and detail may be made therein without departing from the spirit and scope of the invention.

What is claimed is:

1. A semiconductor probe card comprising a printed circuit having a plurality of wiring means thereon,
    a plurality of power probe assemblies extending from said card for contacting an external circuit device to be tested,
    each of said power probe assemblies comprising,
    a ceramic body having at least two opposed surfaces, a voltage contact on one of said surfaces and a ground contact on the other of said surfaces,
    two sets of interdigitated internal metallic plates disposed within said ceramic body, one of said sets of plates being electrically coupled to said voltage contact and extending part way into said body, and the other of said sets of plates being electrically coupled to said ground contact and extending part way into the body, said two sets of plates being separated from one another by the ceramic of said body, and
    a flexible, metallic needle contacting said voltage contact and extending therefrom and adapted for contacting pads on a semiconductor device.

2. The probe card of claim 1 wherein said internal metallic plates are substantially perpendicular to said contacts.

3. The probe card of claim 1 wherein said probe assembly has an L-shaped configuration and said needle is mounted on the shorter leg of said L.

4. The probe card of claim 1 wherein each set of interdigitated internal metallic plates extends more than halfway through the body.

5. The probe card of claim 1 wherein said needle is cantilevered from said probe assembly.

6. A power probe for testing integrated circuit wafers comprising:
    a body formed of a ceramic material having a voltage contact on its upper surface and a ground contact on its lower surface,
    first and second sets of interdigitated internal metallic plates embedded in said body, a first set of said plates beginning at the voltage contact and extending part way into the body, a second set of said plates beginning at the ground contact and extending interdigitally into the body between the other set of said plates, each of said plates separated from each other by the ceramic material of the body, and
    a needle coupled to said voltage contact and adapted to contact a semiconductor circuit interconnection pad.

7. The probe of claim 6 wherein said internal metallic plates are substantially perpendicular to said contacts.

8. The probe structure of claim 6 wherein said body has an L-shaped configuration and said needle is mounted on the shorter leg of said L.

9. The probe of claim 6 wherein each set of internal metallic plates extends more than halfway through the body.

* * * * *